(12) United States Patent
Asai et al.

(10) Patent No.: US 11,264,215 B2
(45) Date of Patent: Mar. 1, 2022

(54) SEMICONDUCTOR MANUFACTURING APPARATUS

(71) Applicant: Kioxia Corporation, Tokyo (JP)

(72) Inventors: Toshiaki Asai, Nagoya Aichi (JP); Noriyuki Asami, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 16/557,257

(22) Filed: Aug. 30, 2019

(65) Prior Publication Data
US 2020/0273679 A1    Aug. 27, 2020

(30) Foreign Application Priority Data
Feb. 26, 2019  (JP) .............................. JP2019-033178

(51) Int. Cl.
*H01J 37/32*  (2006.01)
*H01L 21/687*  (2006.01)
*C23C 16/458*  (2006.01)
*C23C 16/50*  (2006.01)

(52) U.S. Cl.
CPC .... *H01J 37/32642* (2013.01); *C23C 16/4585* (2013.01); *C23C 16/50* (2013.01); *H01J 37/32715* (2013.01); *H01L 21/68785* (2013.01); *H01J 2237/3321* (2013.01)

(58) Field of Classification Search
CPC .......... H01J 37/32715; H01J 37/32642; H01J 2237/3321; C23C 16/4585; C23C 16/50; H01L 21/68785; H01L 21/68757; H01L 21/68735
See application file for complete search history.

(56) References Cited

U.S. PATENT DOCUMENTS

| | | | |
|---|---|---|---|
| 6,013,984 A | 1/2000 | Ellinger et al. | |
| 8,992,686 B2 | 3/2015 | Gomi et al. | |
| 2008/0236749 A1* | 10/2008 | Koshimizu | H01J 37/32165 156/345.33 |
| 2012/0061351 A1* | 3/2012 | Ohata | H01J 37/32091 216/67 |
| 2012/0160808 A1* | 6/2012 | Kikuchi | H01L 21/6831 216/67 |
| 2016/0002778 A1 | 1/2016 | Ravi et al. | |

* cited by examiner

*Primary Examiner* — Yuechuan Yu
(74) *Attorney, Agent, or Firm* — Foley & Lardner LLP

(57) ABSTRACT

A semiconductor manufacturing apparatus includes: a stage configured to support a semiconductor substrate; and a conductive annular member provided at an outer circumferential portion of the stage and configured to enclose the semiconductor substrate when supported on the stage. The stage has a groove that is provided below a lower portion of an inner circumferential end of the annular member.

10 Claims, 10 Drawing Sheets

US 11,264,215 B2

SEMICONDUCTOR MANUFACTURING APPARATUS

CROSS-REFERENCE TO RELATED APPLICATION

This application claims the benefit of and priority to Japanese Patent Application No. 2019-033178, filed Feb. 26, 2019, the entire contents of which are incorporated herein by reference.

FIELD

Embodiments described herein relate generally to a semiconductor manufacturing apparatus.

BACKGROUND

Semiconductor manufacturing apparatuses can include a film deposition apparatus that forms a conductive film on a semiconductor substrate while generating plasma. Such a film deposition apparatus is configured to mount the semiconductor substrate on a stage. The stage has an outer circumferential portion that is provided with an annular member, called an "edge ring", for uniformly generating plasma.

DETAILED DESCRIPTION

During generation of plasma by the film deposition apparatus as described above, a film is formed on the edge ring and the stage as well as on the semiconductor substrate. The film that is formed on the semiconductor substrate and the film that continues from the edge ring to the stage have a potential difference, which may cause occurrence of arcing in some cases. When arcing occurs, the film deposition apparatus is interrupted, thereby obstructing batch film deposition. In addition, arcing may damage a component in the apparatus.

Embodiments described herein provide for a semiconductor manufacturing apparatus that enables avoiding occurrence of arcing.

In general, according to one embodiment, a semiconductor manufacturing apparatus includes: a stage configured to support a semiconductor substrate; and a conductive annular member provided at an outer circumferential portion of the stage and configured to enclose the semiconductor substrate when supported on the stage. The stage has a groove that is provided below a lower portion of an inner circumferential end of the annular member.

Hereinafter, embodiments of the present disclosure will be described with reference to the drawings. The embodiments are not intended to limit the present disclosure.

First Embodiment

Figure 1:
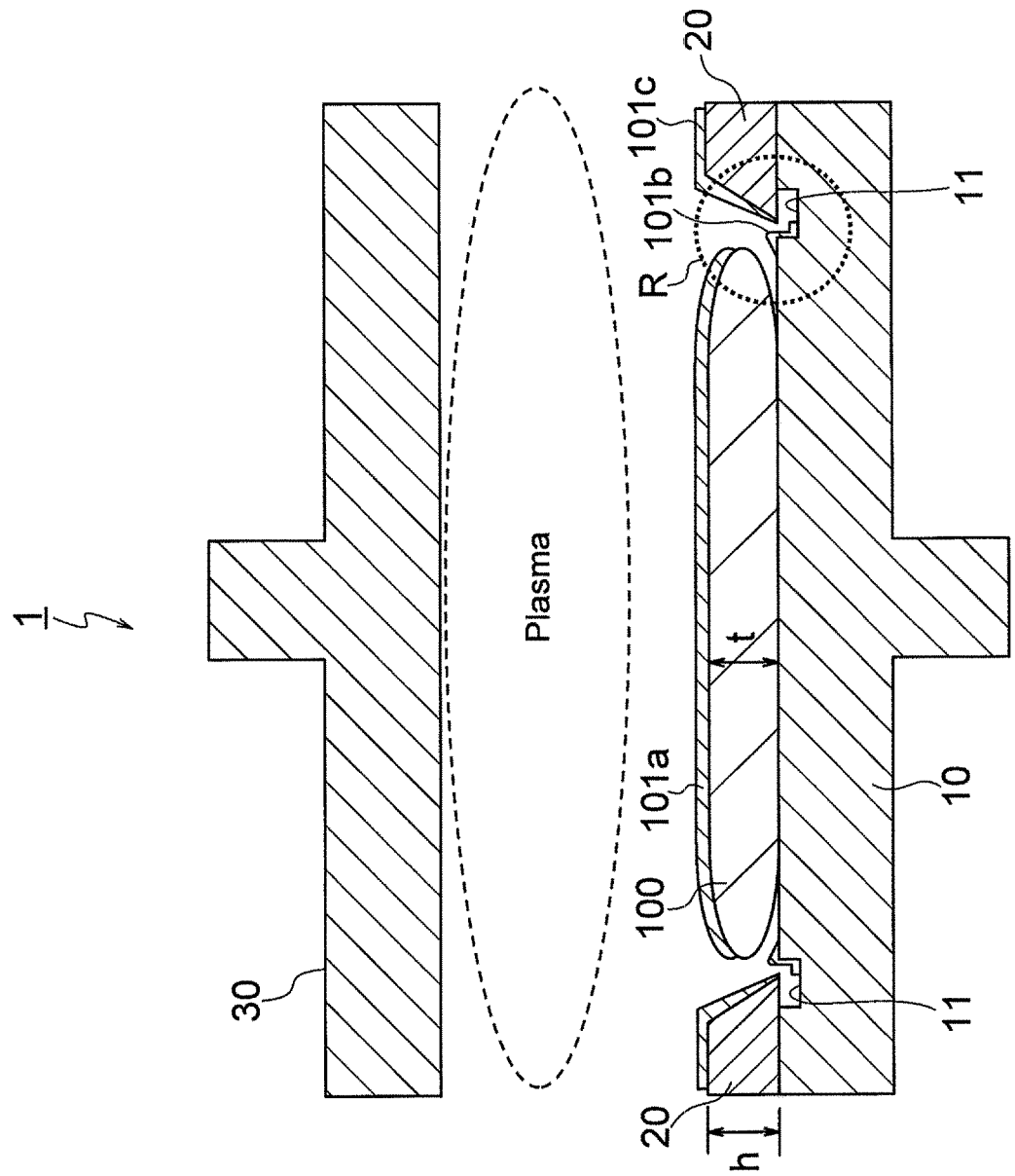
FIG. 1 is a schematic plane view of a semiconductor manufacturing apparatus according to a first embodiment of the present disclosure.
Figure 2:
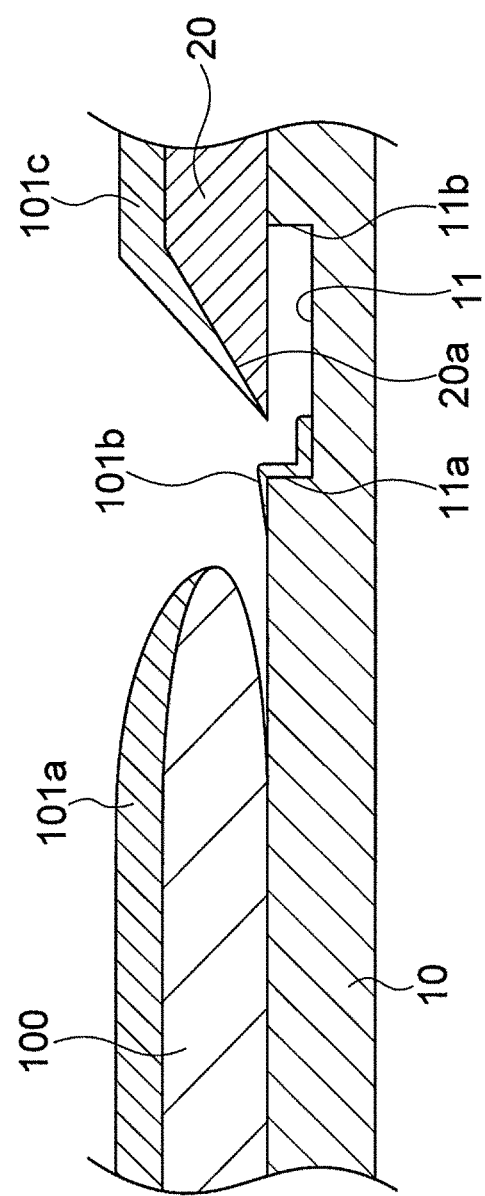
FIG. 2 is an enlarged view of a region R illustrated in FIG. 1 according to the first embodiment of the present disclosure.
Figure 3:
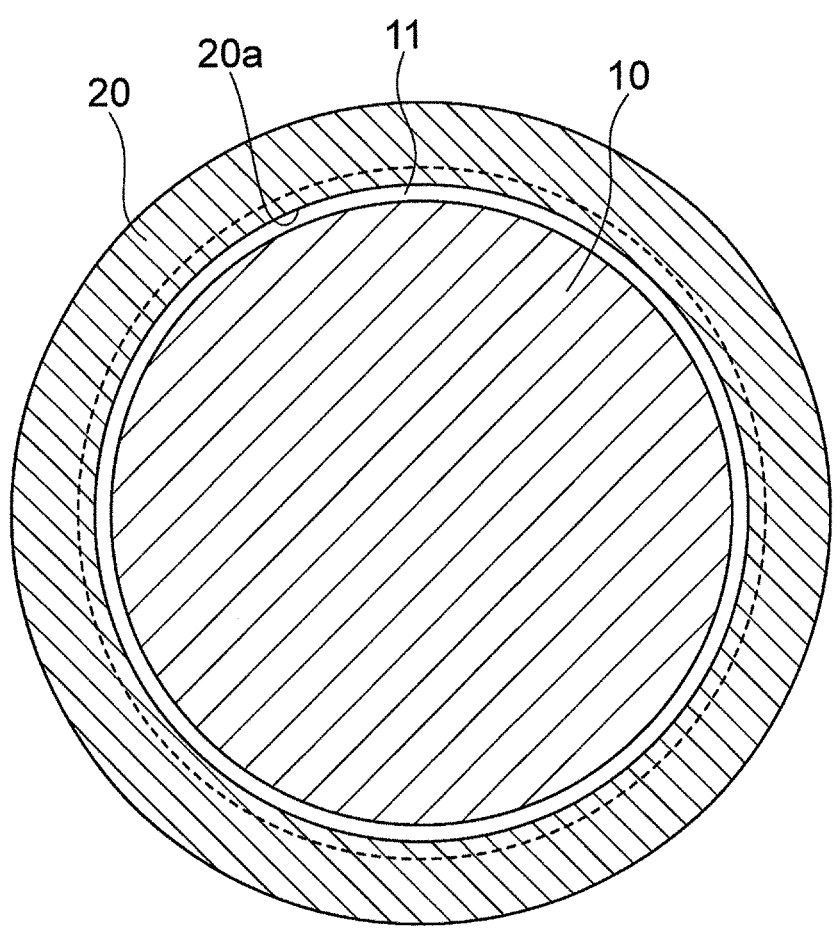
FIG. 3 is a plane view of a principal portion of the semiconductor manufacturing apparatus according to the first embodiment of the present disclosure.

FIG. 1 is a schematic sectional view of a semiconductor manufacturing apparatus according to a first embodiment. FIG. 2 is an enlarged view of a region R illustrated in FIG. 1. FIG. 3 is a plane view of a principal portion of the semiconductor manufacturing apparatus according to the first embodiment.

FIGS. 1 to 3 illustrate a semiconductor manufacturing apparatus 1 that is a plasma chemical vapor deposition (CVD) apparatus configured to perform film deposition by means of a CVD method while generating plasma. The semiconductor manufacturing apparatus 1 includes a stage 10, an edge ring 20, and an electrode plate 30.

The stage 10 has a top surface (e.g., including a mounting area, such as the area on which the depicted substrate 100 is disposed) on which a wafer-shaped semiconductor substrate 100 is to be mounted. The stage 10 has a heating element (not shown) for heating the semiconductor substrate 100. Moreover, the stage 10 has a groove 11 that is provided on the top surface. The groove 11 is annular, as illustrated in FIG. 3.

The edge ring 20 is provided at an outer circumferential portion of the stage 10 so as to enclose (e.g. surround) the mounted semiconductor substrate 100. The edge ring 20 is a conductive annular member with a trapezoidal cross section (e.g., having a slanted inner surface facing the mounting area, wherein a lower portion of the slanted inner surface is closer to the mounting area than is an upper portion of the slanted inner surface). An extending portion of the edge ring 20 (e.g. which includes the inner surface) may extend over the groove 11, and may, in some embodiments, not extend across the groove 11. The edge ring 20 is includes a conductive material.

The electrode plate 30 faces the stage 10 and the edge ring 20. In response to supply of high-frequency power to the electrode plate 30, plasma is generated between the electrode plate 30 and the stage 10.

In this embodiment, the conductive edge ring 20 is provided at the outer circumferential portion of the stage 10. Thus, plasma is uniformly generated between a center portion of the stage 10 and the outer circumferential portion. In order to generate plasma uniformly, a height "h" of the edge ring 20 is desirably equal to or greater than a thickness "t" of the semiconductor substrate 100.

In this embodiment, when a film deposition gas (not shown) is introduced during generation of plasma, a film 101a is formed on the semiconductor substrate 100, which is supported on the stage 10, as illustrated in FIGS. 1 and 2.

Uniformly generated plasma makes the film 101a have a uniform thickness. Moreover, at the same time as the formation of the film 101a, a film 101b is formed on the stage 10, and a film 101c is formed on the edge ring 20. This embodiment uses carbon films as the films 101a, 101b, and 101c, which may be used as masks. However, each of these films may be a film (e.g., a conductive film) other than the carbon film.

Figure 4:
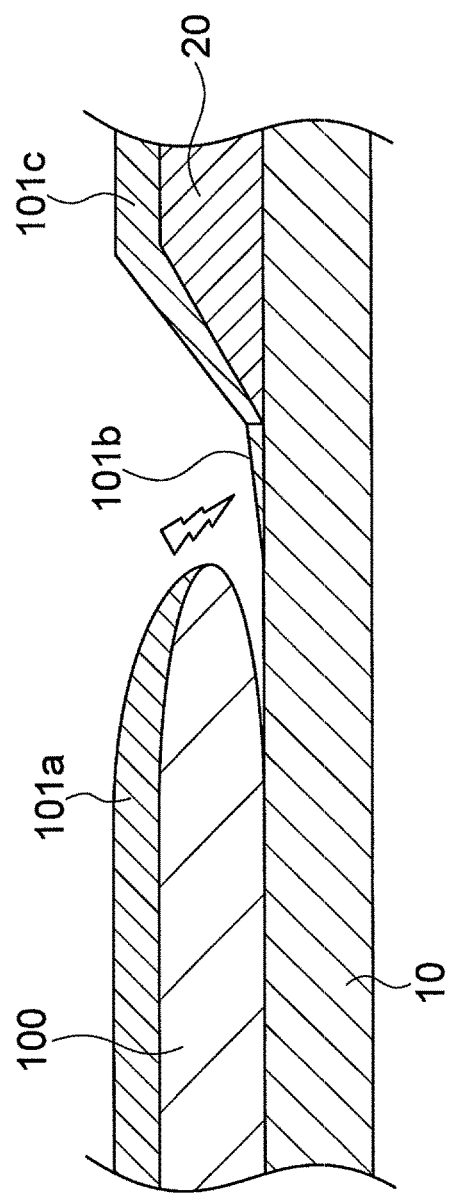
FIG. 4 is an enlarged sectional view of a portion of the semiconductor manufacturing apparatus according to a comparative example.

FIG. 4 is an enlarged sectional view of a portion of the semiconductor manufacturing apparatus according to a comparative example. This semiconductor manufacturing apparatus does not have a groove 11 on the stage 10. Thus, as a result of the film deposition process as described above, the film 101b that is formed on the stage 10 and the film 101c that is formed on the edge ring 20 are integrated. The film 101c and the film 101a that is formed on the semiconductor substrate 100 have a large potential difference. Thus, the potential difference between the film 101b and the film 101a is also great because the integrated film 101b has the same potential as the film 101c, whereby arcing may occur.

On the other hand, in the semiconductor manufacturing apparatus 1 according to this embodiment, the stage 10 has the groove 11 that is provided below a lower portion of an inner circumferential end 20a (e.g., the slanted inner surface) of the edge ring 20, as illustrated in FIG. 2. The groove 11 makes the inner circumferential end 20a of the edge ring 20 and the stage 10 have an extended spatial distance therebetween. This allows the film 101b to be formed on the stage 10 separately from the film 101c on the edge ring 20, and may substantially prevent integration (e.g., contact) of the film 101b and the film 101c. That is, the film 101b is separated from the film 101c that has a large potential difference relative to the film 101a.

Thus, this embodiment decreases the potential difference between the films 101a and 101b, thereby enabling avoidance of occurrence of arcing. This enables batch film deposition of the film 101a on the semiconductor substrate 100. Moreover, damage to a component due to arcing can also be avoided.

Modification Example 1

Figure 5:
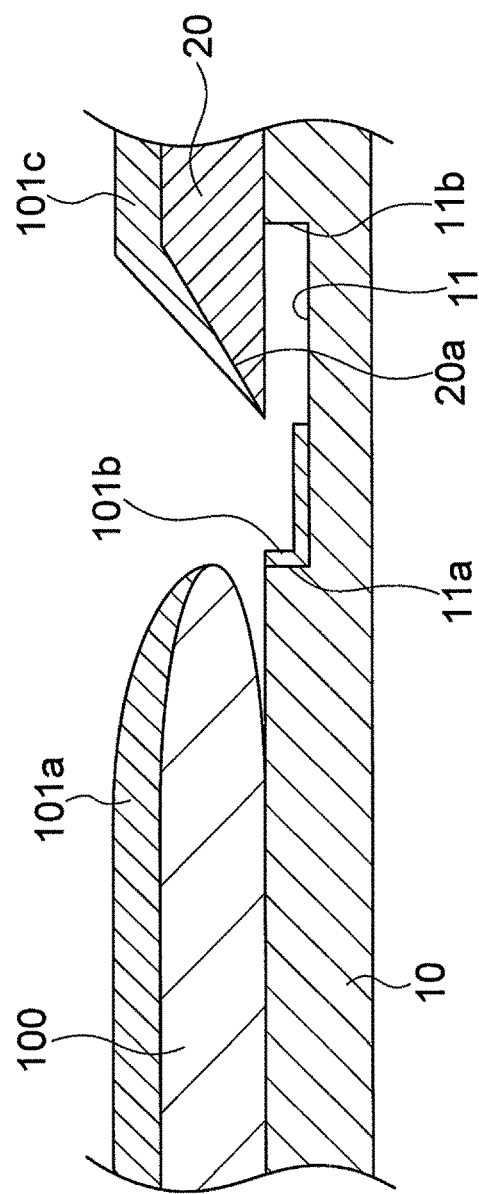
FIG. 5 is a sectional view of a groove according to a modification example 1.

FIG. 5 is a sectional view of the groove 11 according to a modification example 1. In the first embodiment, as illustrated in FIG. 2, the groove 11 has an inner edge portion 11a that is located between a lower portion of an outer circumferential end of the semiconductor substrate 100 and the lower portion of the inner circumferential end 20a of the edge ring 20. On the other hand, the inner edge portion 11a of the groove 11 illustrated in FIG. 5 is located below the lower portion of the outer circumferential end of the semiconductor substrate 100. That is, the inner edge portion 11a may be located on a center side of the stage 10 from the lower portion of the inner circumferential end 20a of the edge ring 20. The inner edge portion 11a may thus extend to, or may extend below a portion of, a mounting area of the stage 10.

In this modification example, as in the first embodiment, the groove 11 has an outer edge portion 11b that is located on an outer circumferential side of the stage 10 from the lower portion of the inner circumferential end 20a of the edge ring 20. This causes the film 101b to be formed separately from the film 101c.

Modification Example 2

Figure 6:
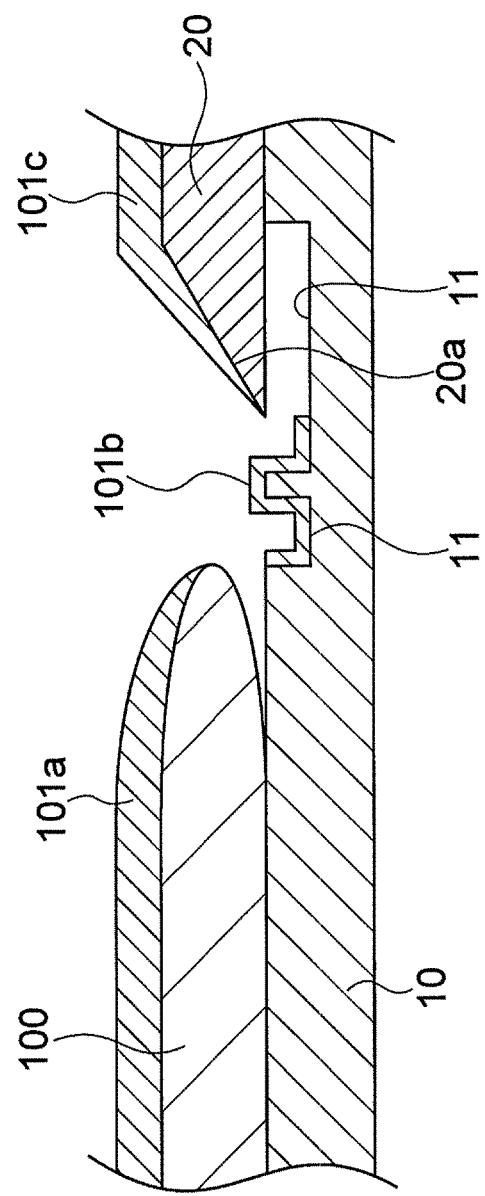
FIG. 6 is a sectional view of the groove according to a modification example 2.
Figure 7:
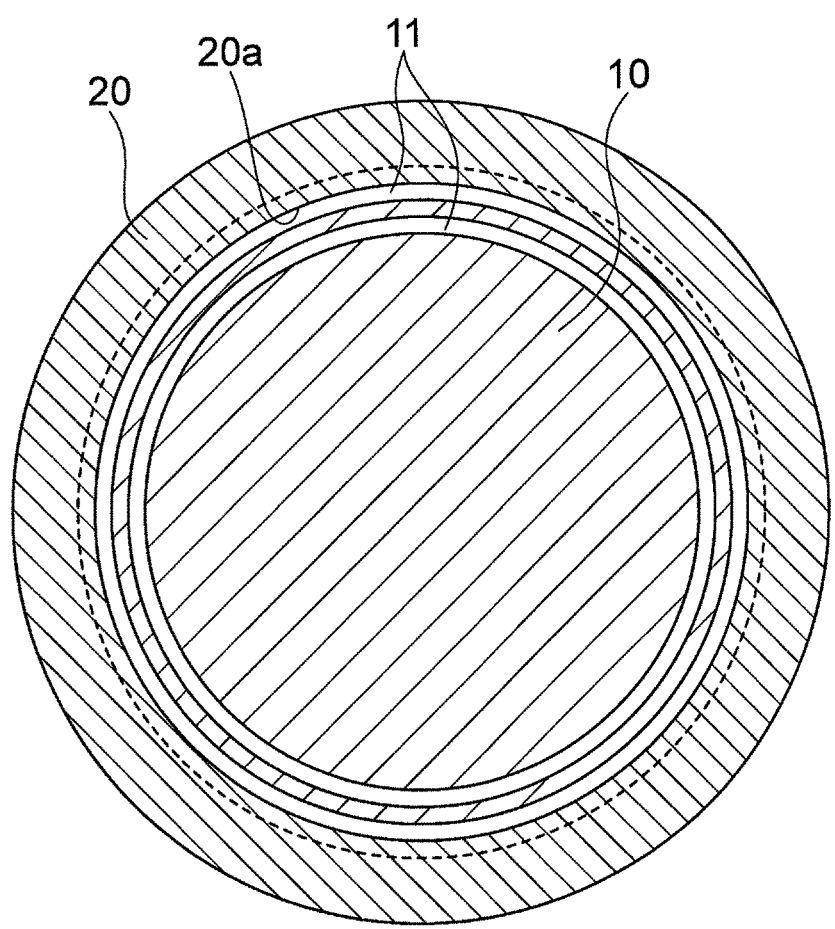
FIG. 7 is a plane view of the groove according to the modification example 2.

FIG. 6 is a sectional view of the groove 11 according to a modification example 2. FIG. 7 is a plane view of the groove 11 according to the modification example 2.

In the first embodiment, as illustrated in FIG. 3, the groove 11 is one annular groove that is provided along (e.g. the entire circumference of) the inner circumferential end 20a of the edge ring 20. On the other hand, in this modification example the groove 11 includes two grooves, including the annular groove (outer groove) and another inner groove that is formed inward of the annular groove, as illustrated in FIGS. 6 and 7. That is, the groove 11 is a double annular groove. In some embodiments, the edge ring 20 extends over the annular groove, but not the inner groove of the groove 11.

This modification example also causes the film 101b to be formed on the stage 10 separately from the film 101c formed on the edge ring 20. This enables avoiding occurrence of arcing in forming the film 101a on the semiconductor substrate 100. The groove 11 may be a triple or more annular groove, instead of the double annular groove.

Modification Example 3

Figure 8:
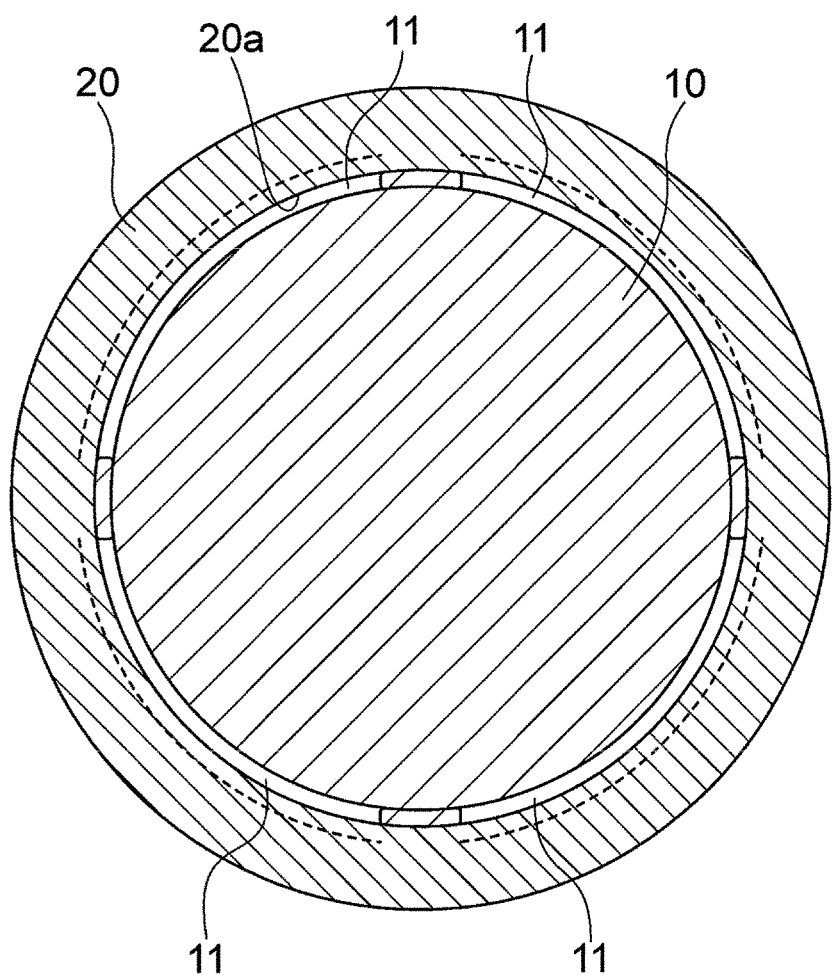
FIG. 8 is a sectional view of the groove according to a modification example 3.

FIG. 8 is a sectional view of the groove 11 according to a modification example 3. In the first embodiment, as illustrated in FIG. 3, the groove 11 is an annular groove that is provided along (e.g. the entire circumference of) the inner circumferential end 20a of the edge ring 20. On the other hand, as illustrated in FIG. 8, the groove 11 according to this modification example is intermittently provided along the inner circumferential end 20a of the edge ring 20. For example, as shown in FIG. 8, the groove 11 may be provided in a plurality of portions (e.g., four portions) that are physically separated from each other.

This modification example enables preventing occurrence of arcing in contrast to the comparative example in which the groove 11 is not formed on the stage 10, as illustrated in FIG. 4.

Second Embodiment

Figure 9:
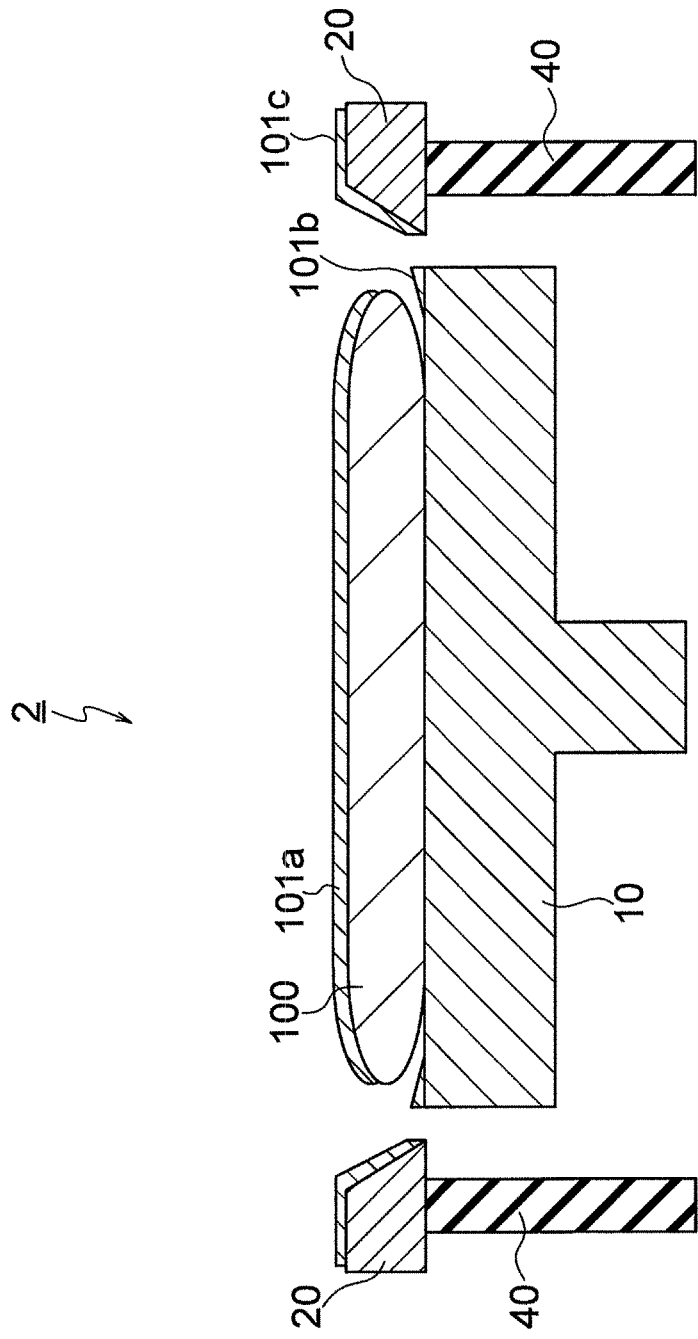
FIG. 9 is a schematic sectional view of the semiconductor manufacturing apparatus according to a second embodiment of the present disclosure.
Figure 10:
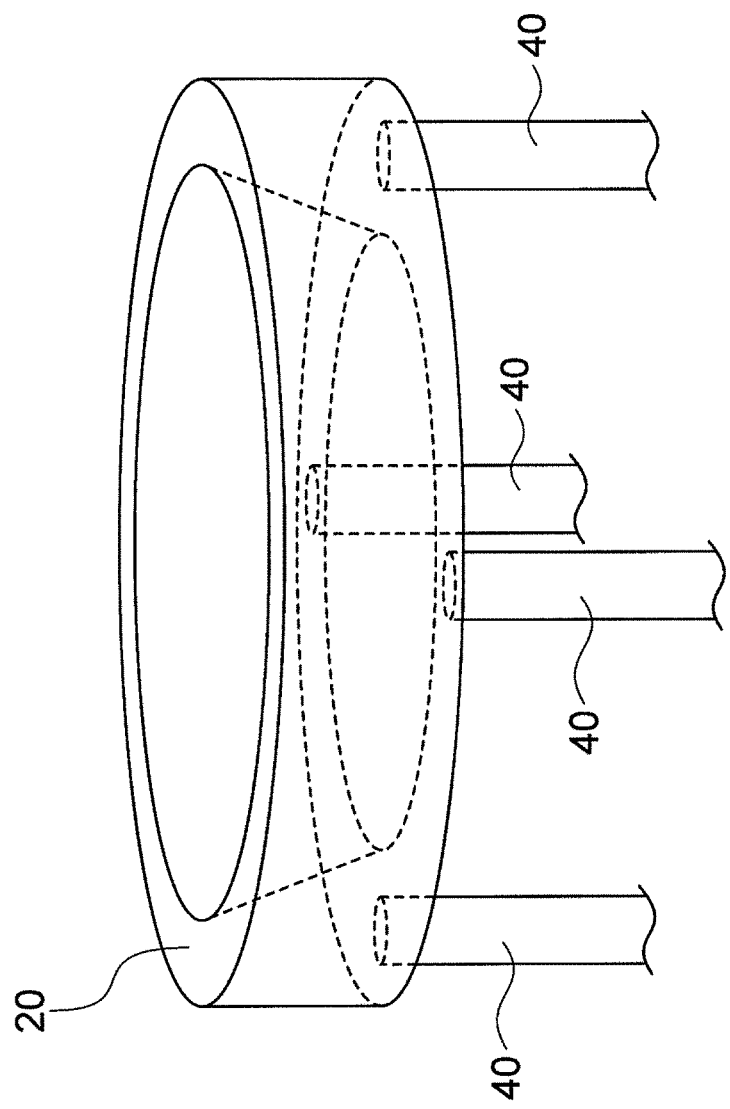
FIG. 10 is a perspective view illustrating a supporting form of an edge ring according to the second embodiment of the present disclosure.

FIG. 9 is a schematic sectional view of the semiconductor manufacturing apparatus according to a second embodiment. FIG. 10 is a perspective view illustrating a supporting form of the edge ring 20 according to the second embodiment. Structural components similar to those in the first embodiment are denoted by the same symbols, and detailed descriptions thereof are not redundantly repeated.

As illustrated in FIG. 9, a semiconductor manufacturing apparatus 2 according to this embodiment has the edge ring 20 that is provided outside of the stage 10. That is, the stage 10 is separated from the edge ring 20. In addition, as illustrated in FIG. 10, the edge ring 20 is supported by (e.g., four) support legs 40. The number of the support legs 40 is any number within a range in which the edge ring 20 can be supported. There is a gap between the support legs 40 and the stage 10 (e.g. such that the support legs 40 and the stage 10 are not in contact). An inner circumferential portion of the edge ring 20 is disposed over the gap. In contrast, according the first embodiment, at least a portion of the edge ring 20 is supported by a component that is connected to the state 10 (e.g. and integrally formed with the stage 10 so as to form a monolithic structure).

The semiconductor manufacturing apparatus 2 thus structured has the stage 10 and the edge ring 20 that are separated by a space. Thus, as illustrated in FIG. 9, the film 101b is formed on the stage 10 separately from the film 101c formed on the edge ring 20 in a film deposition process with use of plasma CVD. This causes decrease in the potential difference between the film 101a, which is formed on the semiconductor substrate 100, and the film 101*b*. Thus, also this embodiment enables avoiding occurrence of arcing as in the first embodiment.

While certain embodiments have been described, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor manufacturing apparatus comprising:
   a stage configured to support a semiconductor substrate; and
   a conductive annular member provided at an outer circumferential portion of the stage and configured to enclose the semiconductor substrate when supported on the stage,
   wherein the stage has a groove that is provided below a lower portion of an inner circumferential end of the annular member, with a portion of the groove directly exposed by the inner circumferential end;
   wherein the groove has an inner edge portion and an outer edge portion, with the lower portion of the inner circumferential end interposed therebetween.

2. The semiconductor manufacturing apparatus according to claim 1, wherein the groove is an annular groove that is provided along the circumference of the inner circumferential end of the annular member.

3. The semiconductor manufacturing apparatus according to claim 2, wherein the groove has an inner edge portion that is located on a center side of the stage from the lower portion of the inner circumferential end, and the groove has an outer edge portion that is located on an outer circumferential side of the stage from the lower portion of the inner circumferential end.

4. The semiconductor manufacturing apparatus according to claim 3, wherein the stage has a mounting area configured to mount the semiconductor substrate, and the inner edge portion of the groove is located below the mounting area.

5. The semiconductor manufacturing apparatus according to claim 1, wherein the groove has an inner edge portion that is located on a center side of the stage from the lower portion of the inner circumferential end, and the groove has an outer edge portion that is located on an outer circumferential side of the stage from the lower portion of the inner circumferential end.

6. The semiconductor manufacturing apparatus according to claim 1, wherein the groove comprises a first inner groove and a second outer groove.

7. The semiconductor manufacturing apparatus according to claim 6, wherein the conductive annular member extends over the second outer groove.

8. The semiconductor manufacturing apparatus according to claim 7, wherein the conductive annular member does not extend over the first inner groove.

9. The semiconductor manufacturing apparatus according to claim 1, wherein the groove comprises a plurality of portions that are separated from each other.

10. The semiconductor manufacturing apparatus according to claim 1, wherein the inner circumferential end of the annular member is a slanted surface.

* * * * *